United States Patent [19]
Yamazaki

[11] Patent Number: 5,733,811
[45] Date of Patent: Mar. 31, 1998

[54] METHOD FOR FABRICATING VERTICAL TYPE MOSFET

[75] Inventor: Kazuzi Yamazaki, Tokyo, Japan

[73] Assignee: NEC Corporation, Tokyo, Japan

[21] Appl. No.: 420,715

[22] Filed: Apr. 11, 1995

Related U.S. Application Data

[63] Continuation of Ser. No. 57,845, May 7, 1993, abandoned.

[30] Foreign Application Priority Data

May 7, 1992 [JP] Japan .................. 4-114396

[51] Int. Cl.$^6$ .................................................. H01L 21/8234
[52] U.S. Cl. .................................. 438/275; 438/279
[58] Field of Search .................. 437/41 DM, 6, 437/31; 438/268, 275, 279

[56] References Cited

U.S. PATENT DOCUMENTS

| | | | |
|---|---|---|---|
| 2,875,505 | 12/1959 | Pfann | 437/157 |
| 4,045,258 | 8/1977 | Kaiser | 148/187 |
| 4,760,431 | 7/1988 | Nakagawa et al. | 257/138 |
| 4,889,820 | 12/1989 | Mori | 437/29 |
| 4,959,699 | 9/1990 | Lidow et al. | 357/23.7 |
| 4,980,740 | 12/1990 | Pattanayak et al. | 357/38 |
| 5,030,581 | 7/1991 | Yakushiji et al. | 437/913 X |
| 5,194,394 | 3/1993 | Terashima | 437/6 |
| 5,286,981 | 2/1994 | Lilja et al. | 437/41 |
| 5,288,653 | 2/1994 | Enjoh | 437/41 |
| 5,443,999 | 8/1995 | Uenishi et al. | 437/6 |

*Primary Examiner*—Jey Tsai
*Assistant Examiner*—Brian K. Dutton
*Attorney, Agent, or Firm*—Sughrue, Mion, Zinn, Macpeak & Seas, PLLC

[57] ABSTRACT

An epitaxial layer of a first conductivity type is grown on a main surface of a semiconductor substrate of the first conductivity type. After a gate oxide film is formed on the entire surface of the epitaxial layer, a gate electrode made of polysilicon and having a plurality of stripe sections and an electrode leading-out section is formed. Then, ions are implanted using a first resist and the gate electrode and a deep well of a second conductivity type for raising a drain breakdown characteristic is formed in the surface region of the epitaxial layer by conducting a thermal oxidation process. After ions are implanted using a second resist and the gate electrode, a plurality of bases of the second conductivity type are formed in the surface region of the epitaxial layer by conducting a thermal oxidation process. These bases are connected with one another immediately below a part of each stripe section which part is near the electrode leading-out section of the gate electrode. This arrangement of a vertical MOSFET prevents the inversion of the P-type well to N-type.

4 Claims, 9 Drawing Sheets

METHOD FOR FABRICATING VERTICAL TYPE MOSFET

This is a Continuation of application Ser. No. 08/057,845 filed May 7, 1993, now abandoned.

BACKGROUND OF THE INVENTION (1) Field of the Invention

The present invention relates to a method for fabricating a MOSFET (metal-oxide-semiconductor field-effect transistor), and more particularly to a method for fabricating a vertical MOSFET for VHF or UHF band broadcasting devices.

(2) Description of the Related Art

A conventional method for fabricating a vertical MOSFET of the kind to which the present invention relates is first explained with reference to FIGS. 1A–1C through 4A–4C.

As shown in FIGS. 1A, 1B and 1C, an N$^-$-type epitaxial layer 2 is grown on an N$^+$-type silicon substrate 1.

Next, as shown in FIG. 1C which is a cross-sectional view taken along line 1C—1C of FIG. 1A, a deep P-type well 3 is formed leaving a drain region on a surface of the N$^-$-type epitaxial layer 2. Here, the formation of the P-type well 3 enables to raise or enhance a drain breakdown characteristic.

Then, the gate oxide film 4 is formed followed by the formation of a gate electrode 5 having a comb shaped structure.

Next, as shown in FIGS. 2A, 2B and 2C, ions are implanted using a resist (not shown) and a gate electrode 5 as masks and, after thermal oxidation, a P-type base 6 which becomes a channel region is formed. The threshold voltage $V_T$ and the mutual conductance $g_m$ are determined depending on a concentration and a depth of this P-type base 6.

Next, as shown in FIGS. 3A, 3B and 3C, a P$^+$-type back gate 7 and an N$^+$-type source 8 are formed.

Then, as shown in FIGS. 4A, 4B and 4C, an interlayer insulating film 9 is formed and, then, contact holes are opened and source electrodes 10 are formed. In this way, an element portion of the vertical MOSFET is completed.

In this vertical MOSFET, when a positive voltage is applied to the gate electrode 5, the channel region becomes conductive allowing a current to flow to the source electrode 10 from the drain of the N$^+$-type silicon substrate at the back surface of the vertical MOSFET. The drain breakdown voltage is determined by a PN-junction diode formed between the P-type well 3 to which a source/drain bias voltage is applied as well as the P-type base 6 and the N$^-$-type epitaxial layer 2. Since the drain electric field is not applied to the gate electrode 5, the operation can be carried out at a high power supply voltage.

In the conventional vertical MOSFET explained above, the ion-implantation is made from one side of a stripe section of the gate electrode 5. Consequently, as shown in FIG. 4B, at a position immediately below an electrode leading-out section at the opposite side, there exists a low concentration region in which no P-type base 8 is present within the P-well 3.

One of the problems in the conventional vertical type MOSFET has been that the surfaces of the P-type well 3 and P-type base 8 immediately below the gate electrode 5 tend to be inverted to an N-type region due to mobile ionic charges such as sodium (Na) or other alkali ions, thereby causing the channel region to become conductive and a leakage current to flow.

SUMMARY OF THE INVENTION

It is, therefore, an object of the present invention to overcome the problems existing in the conventional method for fabricating the vertical MOSFET and to provide an improved method for the same.

According to one aspect of the present invention, there is provided a method for fabricating a vertical MOSFET, the method comprising the steps of:

growing an epitaxial layer of a first conductivity type on a main surface of a semiconductor substrate of the first conductivity type;

forming a gate oxide film on an entire surface of the epitaxial layer;

forming a gate electrode made of polysilicon and having a stripe section and an electrode leading-out section;

forming, after ions are implanted using a first resist and the gate electrode, a well of a second conductivity type on the surface of the epitaxial layer by conducting a thermal oxidation process; and forming, after ions are implanted using a second resist and the gate electrode, a plurality of bases of the second conductivity type each connected with another immediately below the stripe section at a side of the electrode leading-out section of the gate electrode, on the surface of the epitaxial layer by conducting a thermal oxidation process.

According to this invention, the high concentration P$^+$-type bases are connected with one another immediately below the gate electrode of polysilicon and at the electrode leading-out side of the stripe section of the gate electrode 5. Consequently, this solves the problem that existed in the prior art wherein the P-type well immediately below and the surface of the P-type base are inverted to the N-type region due to mobile ionic charges such as sodium (Na) or other alkali ions thereby causing a channel region to be conductive and a leakage current to flow.

BRIEF DESCRIPTION OF THE DRAWINGS

The above and other objects, features and advantages of the present invention will be apparent from the following description of preferred embodiments of the invention explained with reference to the accompanying drawings, in which:

FIG. 10 is a graph showing a frequency distribution (number of times) of the drain leakage current $I_{dss}$.

PREFERRED EMBODIMENTS OF THE INVENTION

Now, preferred embodiments of the invention will be explained hereunder with reference to the accompanying drawings.

A first embodiment of the invention is first explained with reference to FIGS. 5A–5C through FIGS. 8A–8C.

Figure 1A:
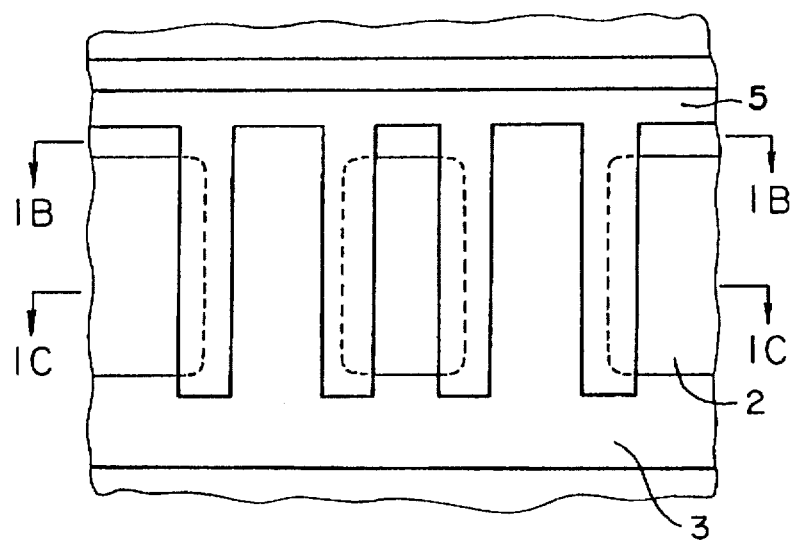
FIGS. 1A to 1C show a first fabrication step for a conventional vertical MOSFET, FIG. 1A being a plan view of the conventional vertical MOSFET, FIG. 1B being a sectional view taken alone line 1B—1B in FIG. 1A, and FIG. 1C being a sectional view taken along line 1C—1C FIG. 1A.
Figure 1B:
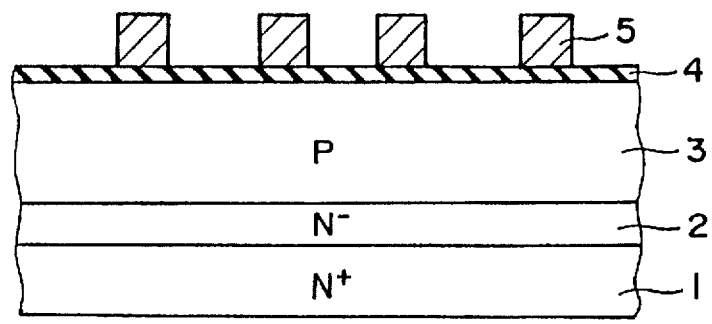
Figure 1C:
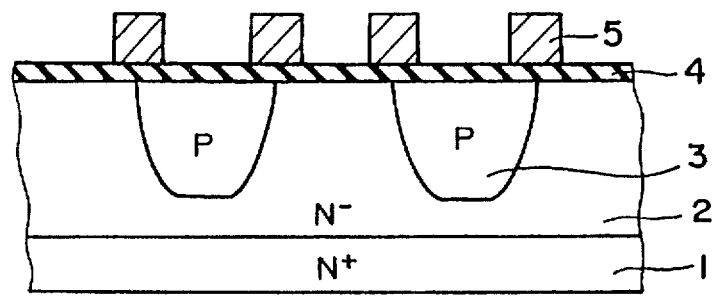
Figure 2A:
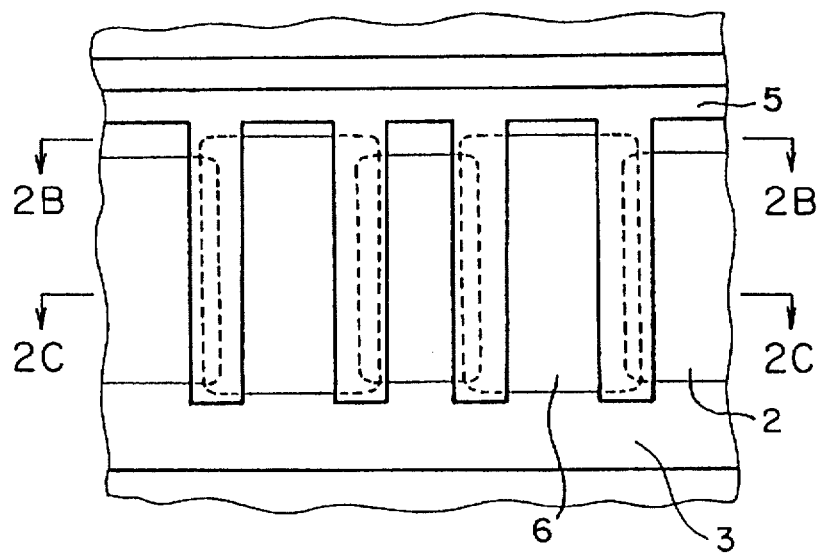
FIGS. 2A to 2C show a second fabrication step for the conventional vertical MOSFET, FIG. 2A being a plan view of the MOSFET, FIG. 2B being a sectional view taken alone line 2B—2B in FIG. 2A, and FIG. 2C being a sectional view taken alone line 2C—2C in FIG. 2A.
Figure 2B:
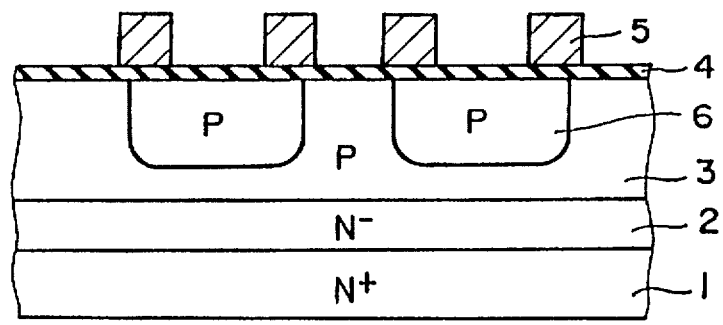
Figure 2C:
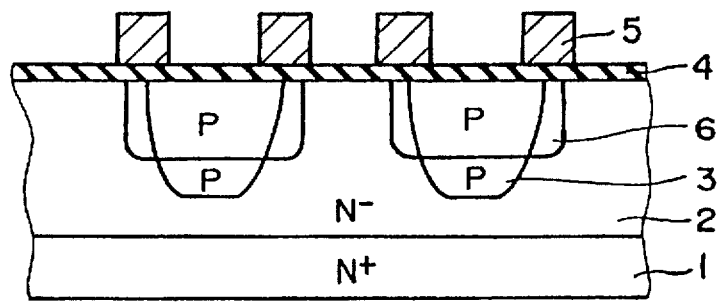
Figure 3A:
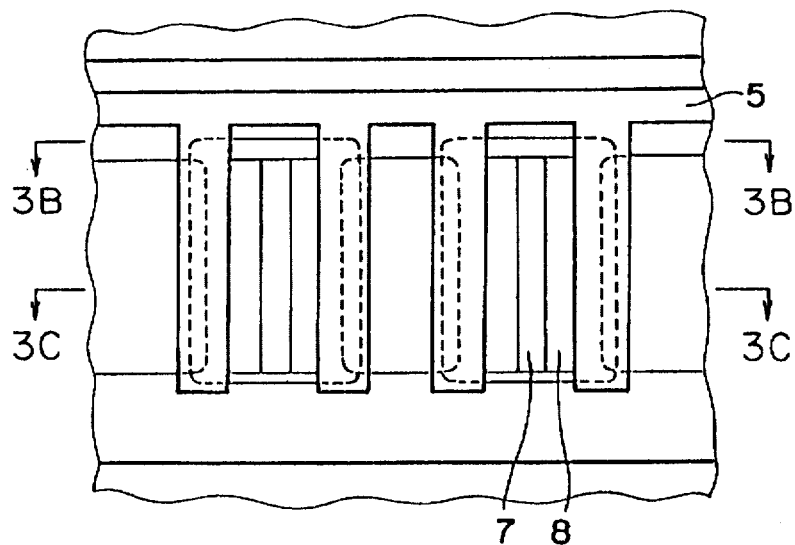
FIGS. 3A to 3C show a third fabrication step for the conventional vertical MOSFET, FIG. 3A being a plan view of the MOSFET, FIG. 3B being a sectional view taken along line 3B—3B in FIG. 3A, and FIG. 3C being a sectional view taken along line 3C—3C in FIG. 3A.
Figure 3B:
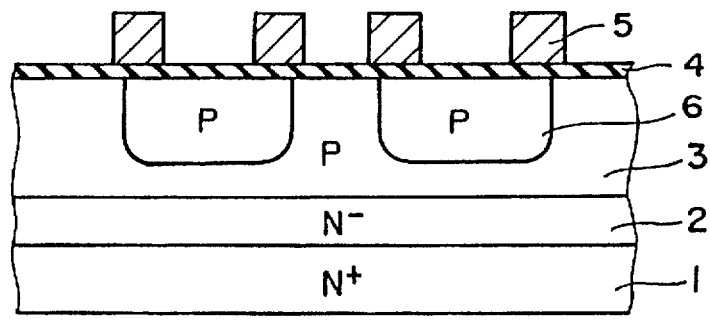
Figure 3C:
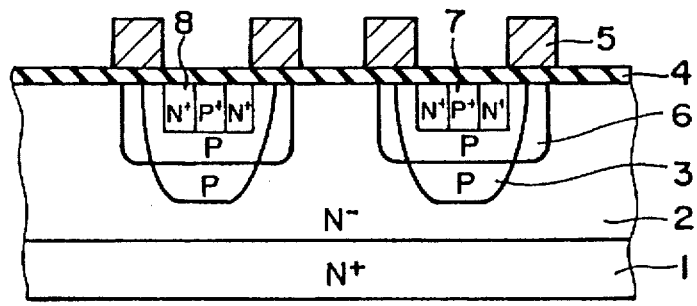
Figure 4A:
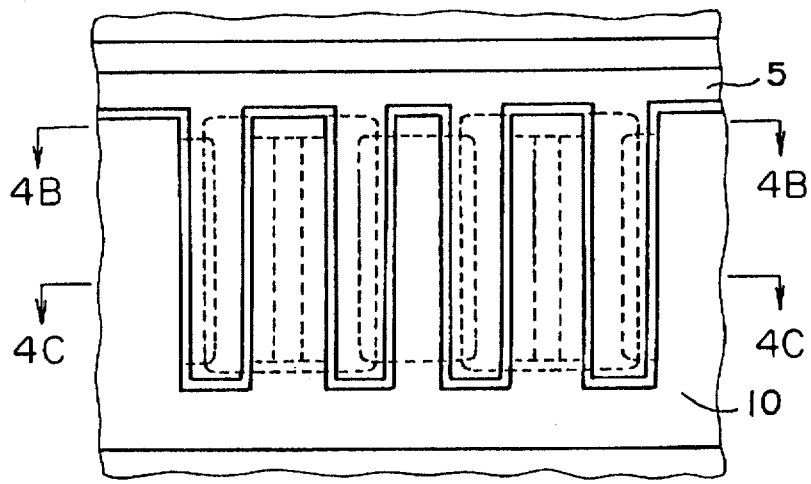
FIGS. 4A to 4C show a fourth fabrication step for the conventional vertical MOSFET, FIG. 4A being a plan view of the MOSFET, FIG. 4B being a sectional view taken along line 4B—4B in FIG. 4A, and FIG. 4C being a sectional view taken along line 4C—4C in FIG. 4A.
Figure 4B:
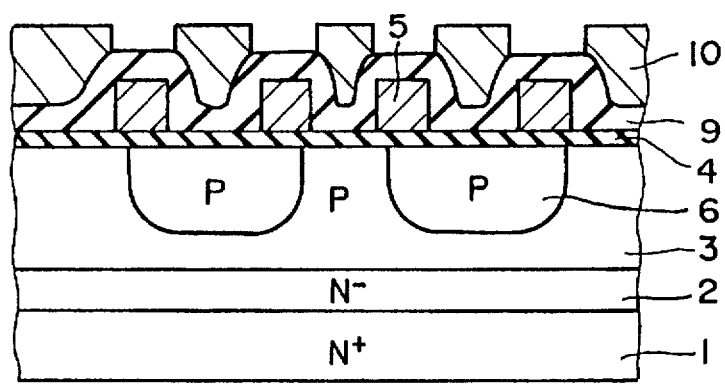
Figure 4C:
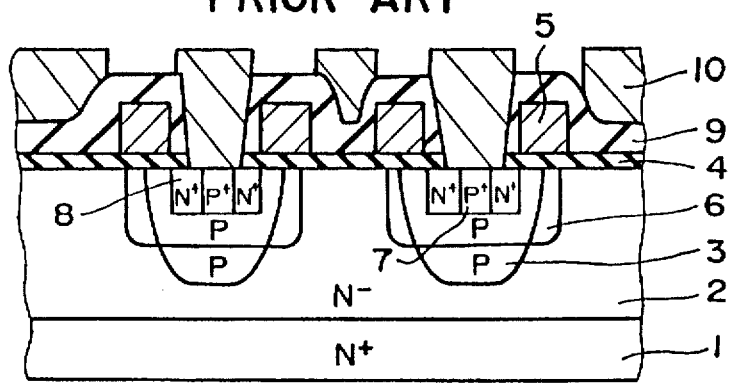
Figure 5A:
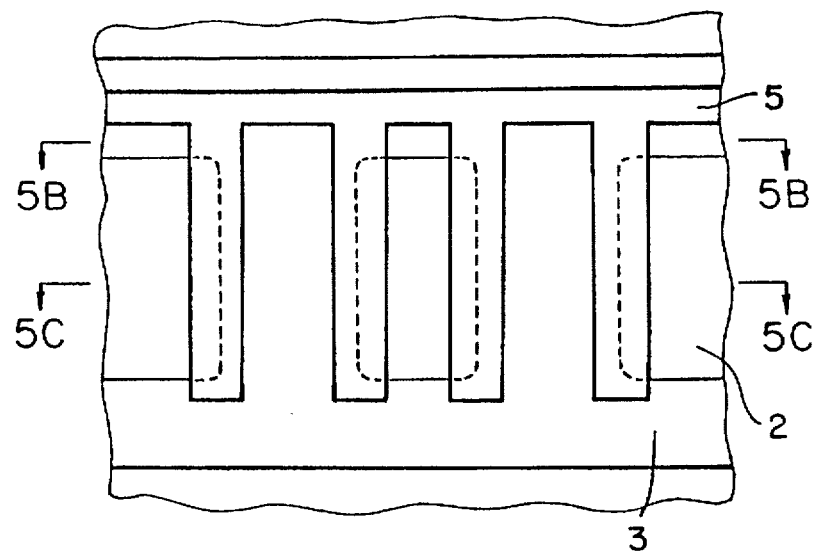
FIGS. 5A to 5C show a first fabrication step for a vertical MOSFET of a first embodiment according to the present invention, FIG. 5A being a plan view of the MOSFET, FIG. 5B being a sectional view taken along line 5B—5B in FIG. 5A, and FIG. 5C being a sectional view taken along line 5C—5C in FIG. 5A.
Figure 5B:
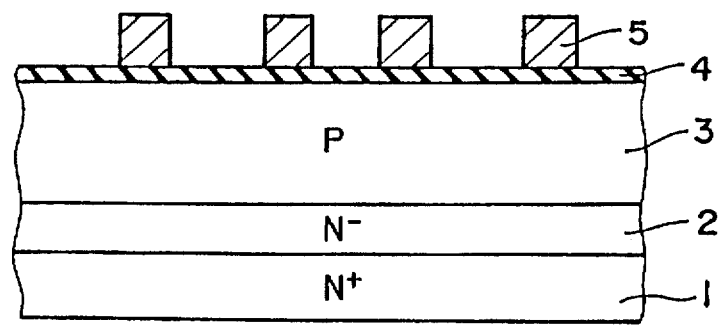
Figure 5C:
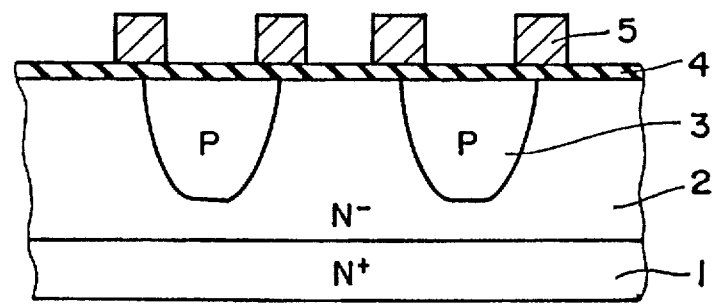

As shown in FIGS. 5A, 5B and 5C, an N$^-$-type epitaxial layer 2 is grown on an N$^+$-type silicon substrate 1 and, in the N$^-$-type epitaxial layer 2, a deep P-type well 3 is formed leaving a drain region on a surface thereof. Here, the formation of the P-type well 3 enables to enhance or raise a drain breakdown characteristic. Then, the gate oxide film 4 is formed followed by the formation of a gate electrode 5 having a comb shaped structure.

Figure 6A:
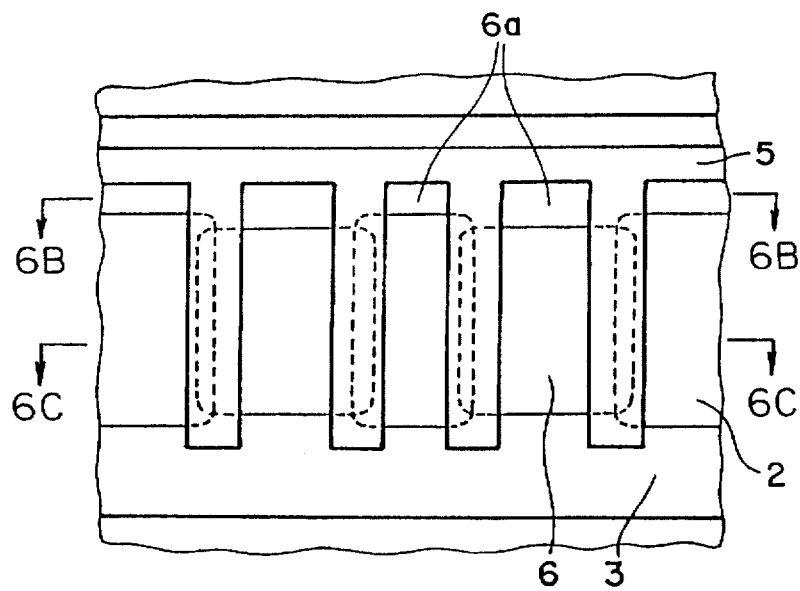
FIGS. 6A to 6C show a second fabrication step for the vertical MOSFET of the first embodiment, FIG. 6A being a plan view of the MOSFET, FIG. 6B being a section view taken along line 6B—6B in FIG. 6A, and FIG. 6C being a sectional view taken along line 6C—6C in FIG. 6A.
Figure 6B:
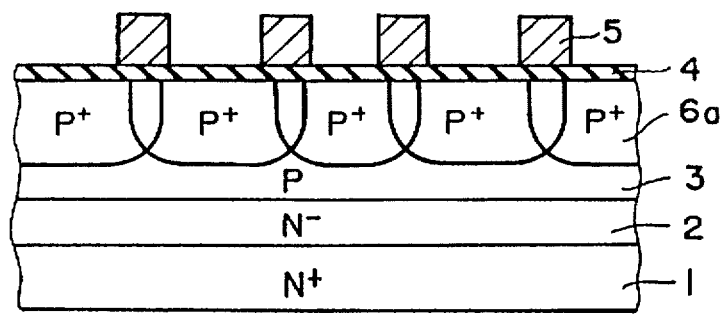
Figure 6C:
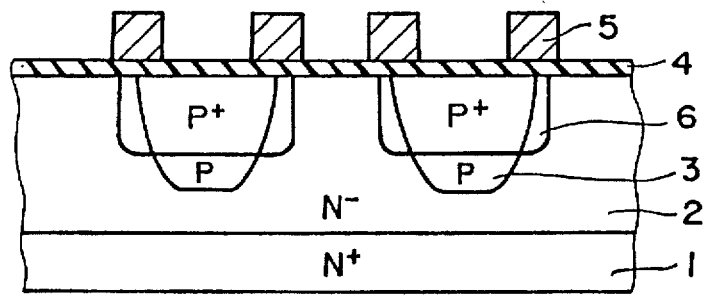

Next, as shown in FIGS. 6A, 6B and 6C, ions are implanted using a resist (not shown) and a gate electrode 5 as masks and, through thermal diffusion at a high temperature, a P$^+$-type base 6a which becomes a channel region is formed. Since the opening of the resist is made large, the area of the P$^+$-type base region 6a is larger than that in the prior art example. Due to the high temperature thermal diffusion, both the sides of the stripe section of the gate electrode 5 are diffused in a depth such that adjacent ones of the P$^+$-type bases 6a are connected with one another. The concentration and the diffusion depth of the P$^+$-type base 6a determine the threshold voltage $V_T$ and the mutual conductance $g_m$.

Figure 7A:
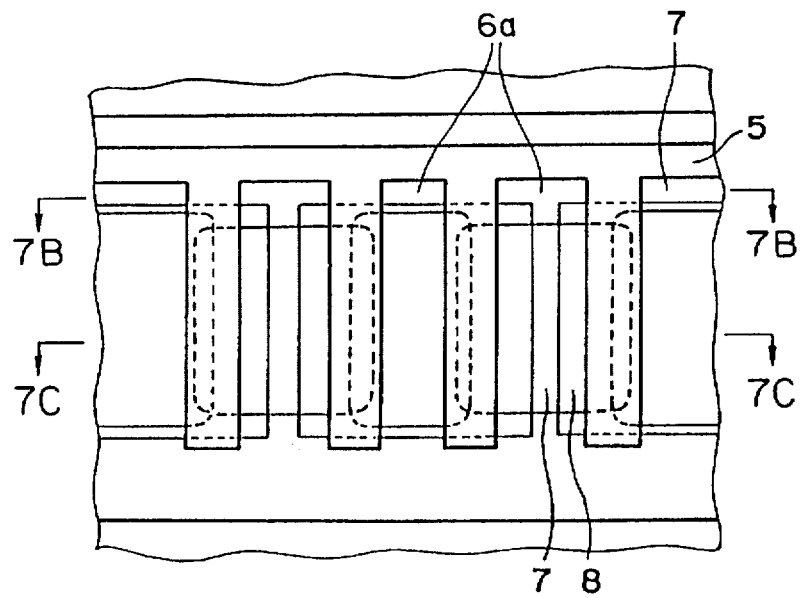
FIGS. 7A to 7C show a third fabrication step for a vertical MOSFET of the first embodiment, FIG. 7A being a plan view of the MOSFET, FIG. 7B being a sectional view taken along line 7B—7B in FIG. 7A, and FIG. 7C being a sectional view taken along line 7C—7C in FIG. 7A.
Figure 7B:
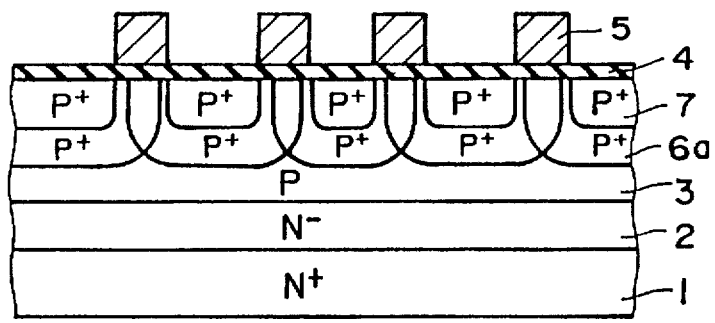
Figure 7C:
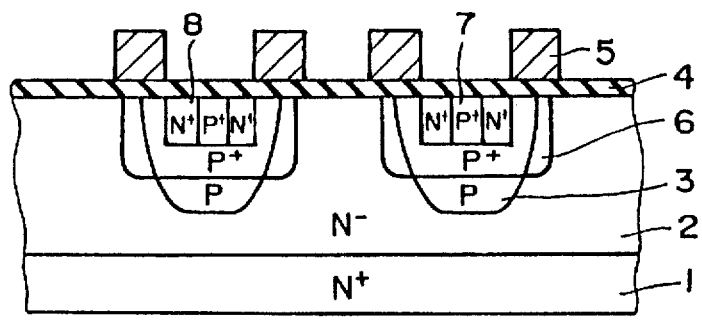

Next, as shown in FIGS. 7A, 7B and 7C, a P$^+$-type back gate 7 and an N$^+$-type source 8 are formed.

Figure 8A:
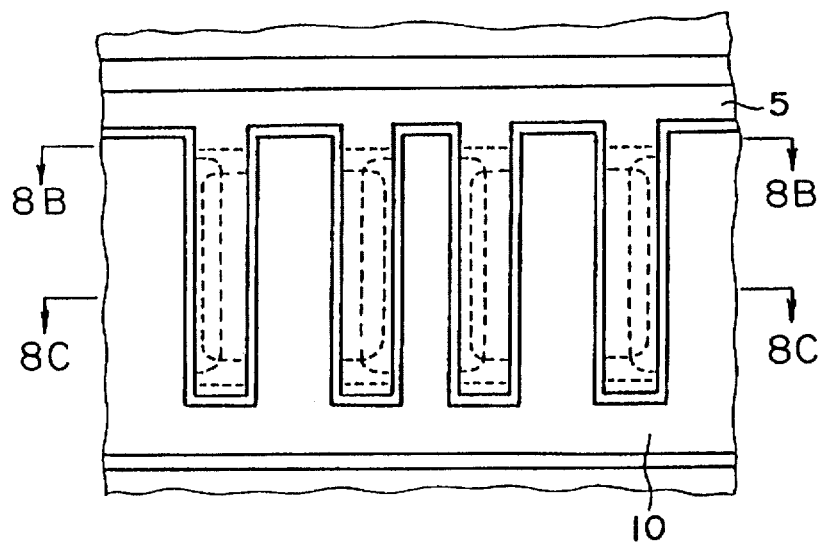
FIGS. 8A to 8C show a fourth fabrication step for the vertical MOSFET of the first embodiment, FIG. 8A being a plan view of the MOSFET, FIG. 8B being a sectional view taken along line 8B—8B in FIG. 8A, and FIG. 8C being a sectional view taken alone line 8C—8C in FIG. 8A.
Figure 8B:
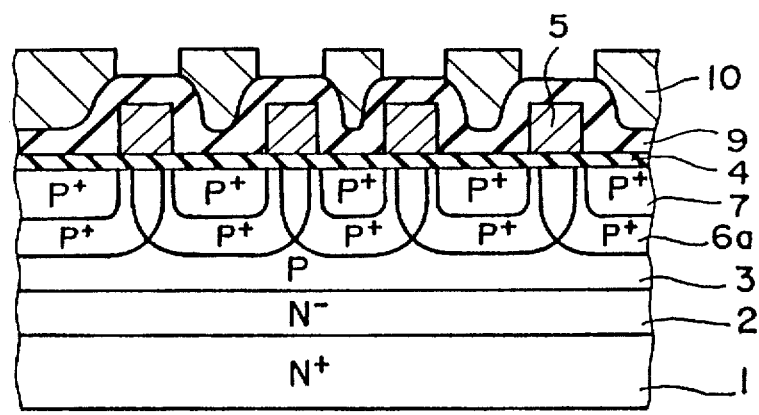
Figure 8C:
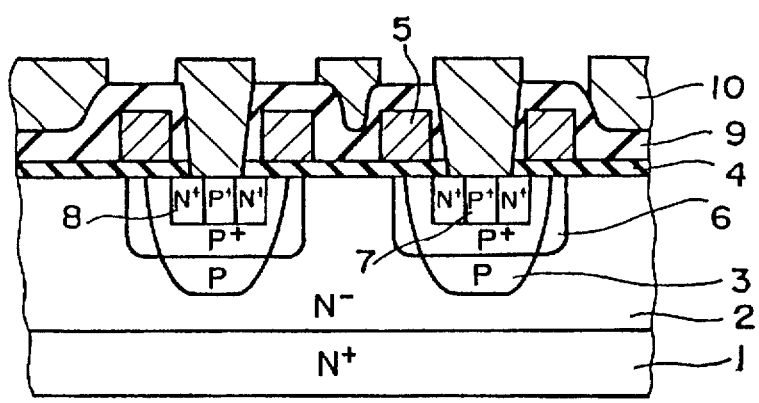

Then, as shown in FIGS. 8A, 8B and 8C, an interlayer insulating film 9 is formed and, after a contact hole is opened, a source electrode 10 is formed.

In this embodiment, at an electrode leading-out section of the late electrode 5, ions are implanted from both the sides of the stripe section thereof and, through a drive-in diffusion by a thermal oxidation process, a P$^+$-type base 6a is formed. The P$^+$-type bases 6a are connected with adjacent ones thereof at the respective electrode leading-out sections. As a result, the P$^+$-type base 6a is formed in a high concentration immediately below the stripe section at the leading-out side of the gate electrode 5. At the channel region, there does not exist a low concentration layer that is easily inverted from the P-type to the N-type and this makes it possible to reduce the development of the leakage current.

Figure 9A:
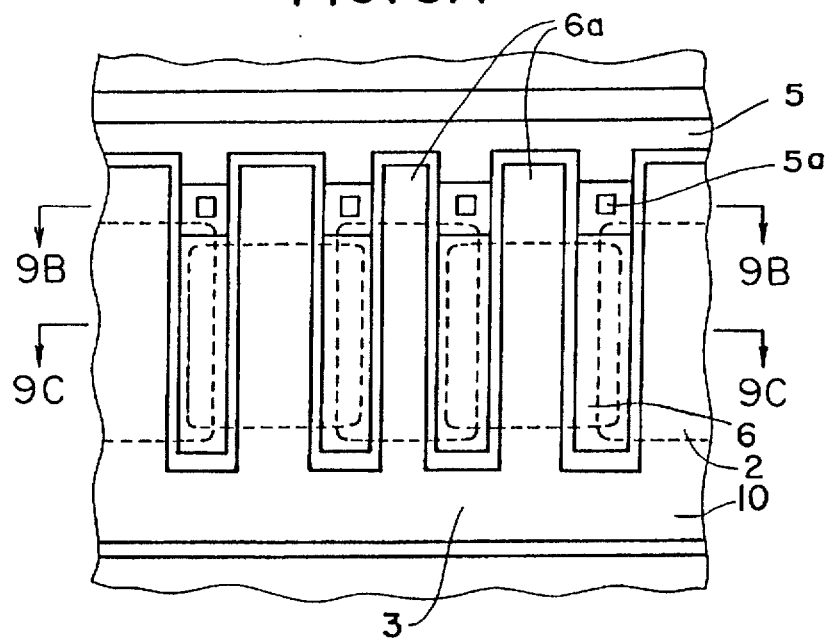
FIGS. 9A to 9C show a fabrication step for a vertical MOSFET of a second embodiment according to the present invention, FIG. 9A being a plan view of the MOSFET, FIG. 9B being a sectional view taken along line 9B—9B in FIG. 9A, and FIG. 9C being a sectional view taken along line 9C—9C in FIG. 9A.
Figure 9B:
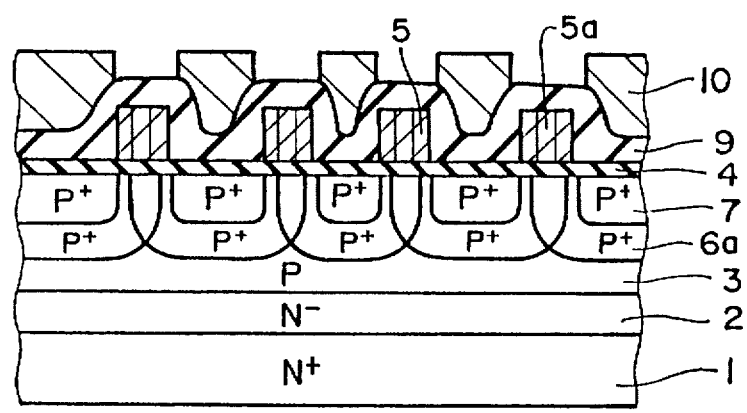
Figure 9C:
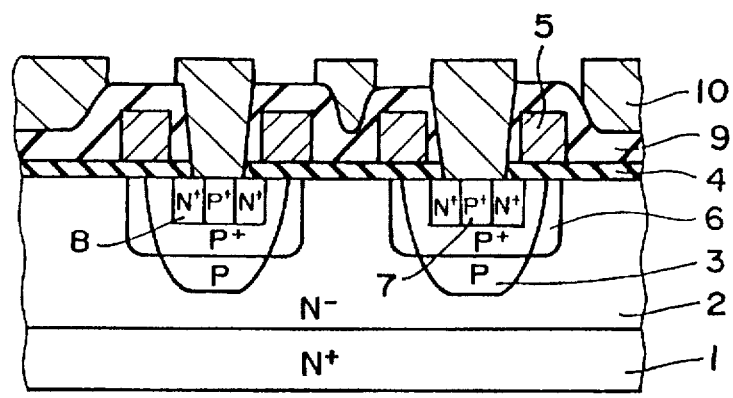

Next, a second embodiment of the present invention is explained with reference to FIGS. 9A, 9B and 9C.

In the arrangement according to this second embodiment, an opening 5a is provided at a portion of the stripe section at the electrode leading-out side of the gate electrode 5. Consequently, it is possible to raise locally the concentration of the P$^+$-type base 6a, which is formed by the ion-implantation using the resist (not shown) and the electrode 5 as masks, at a position immediately below the opening 5a of the P$^+$-type base 6a. This arrangement has proven to be more effective in reducing the development of the leakage current as compared with that in the first embodiment.

The above explanation has been made with respect to the N-channel vertical MOSFET. However, it is to be noted that the same advantages can be achieved when the invention is applied to other type transistors such as the P-channel vertical MOSFET and IGBT (insulated gate bipolar transistor).

The graph of FIG. 10 shows that, whereas the average value of the drain leakage current ($I_{dss}$) obtained according to the conventional method was 800 μA, this has been reduced only to a several μA according to the present invention.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A method for fabricating a vertical MOSFET, said method comprising the steps of:

growing an epitaxial layer of a first conductivity type on a main surface of a semiconductor substrate of said first conductivity type;

forming a gate oxide film on the entire surface of said epitaxial layer;

forming, on said gate oxide film, a gate electrode made of polysilicon and having a plurality of stripe sections and an electrode leading-out section, said plurality of stripe sections extending from said electrode leading-out section;

forming, after first ions are implanted using a first resist and said gate electrode as a mask, a plurality of wells of a second conductivity type in a surface region of said epitaxial layer by conducting a thermal oxidation process; and forming, after second ions are implanted using a second resist and said gate electrode as a mask, a plurality of bases of said second conductivity type each connected with another immediately below a part of each of said plurality of stripe sections which is adjacent said electrode leading-out section of said gate electrode, in a surface region of said epitaxial layer by conducting a thermal oxidation process.

2. A method for fabricating a vertical MOSFET according to claim 1, in which said first conductivity type is an N-type and said second conductivity type is a P-type.

3. A method for fabricating a vertical MOSFET according to claim 1, in which said ions first and second are implanted from both sides of each of said plurality of stripe sections adjacent said electrode leading-out section of said gate electrode.

4. A method for fabricating a vertical MOSFET according to claim 1, further comprising a step of forming an opening at a portion of each of said stripe sections which is adjacent said electrode leading-out section of said gate electrode.

* * * * *